United States Patent
Roy

[11] Patent Number: 6,150,269
[45] Date of Patent: Nov. 21, 2000

[54] COPPER INTERCONNECT PATTERNING

[75] Inventor: Sudipto Ranendra Roy, Singapore, Singapore

[73] Assignee: Chartered Semiconductor Manufacturing Company, Ltd., Singapore, Singapore

[21] Appl. No.: 09/151,953

[22] Filed: Sep. 11, 1998

[51] Int. Cl.[7] .................... H01L 21/44; H01L 21/461; H01L 23/48; H01L 23/34
[52] U.S. Cl. .................... 438/687; 438/638; 438/720; 438/722; 438/740; 438/745; 438/754; 257/762
[58] Field of Search .................... 438/687, 638, 438/627, 654, 679, 720, 722, 740, 745, 754; 257/762

[56] References Cited

U.S. PATENT DOCUMENTS

| | | | |
|---|---|---|---|
| 4,395,294 | 7/1983 | Hobbins et al. | 148/6.14 |
| 4,904,340 | 2/1990 | Miracky et al. | 156/643 |
| 5,482,174 | 1/1996 | Namiki et al. | 216/41 |
| 5,567,300 | 10/1996 | Datta et al. | 205/652 |
| 5,585,673 | 12/1996 | Joshi et al. | 257/751 |
| 5,595,937 | 1/1997 | Mikagi | 437/192 |
| 5,614,765 | 3/1997 | Avanzino et al. | 257/774 |
| 5,674,787 | 10/1997 | Zhao et al. | 437/230 |
| 5,723,387 | 3/1998 | Chen | 438/692 |
| 5,736,457 | 4/1998 | Zhao | 438/624 |
| 5,968,847 | 10/1999 | Ye et al. | 438/734 |
| 6,001,730 | 12/1999 | Farkas et al. | 438/627 |
| 6,008,140 | 12/1999 | Ye et al. | 438/742 |

*Primary Examiner*—Savitri Mulpuri
*Assistant Examiner*—Ha Tran Nguyen
*Attorney, Agent, or Firm*—George O. Saile; Rosemary L. S. Pike

[57] ABSTRACT

A improved and new method for forming dual damascene etch back of copper lines and interconnects (studs) using a combination of oxidation of Cu and chemical/mass transport of the Cu oxide by the action of acid. The etch back solves the dishing problem in that it planarized the Cu. Etch back rates can be high at high temperatures. The surface of the substrate is kept clean and free of polishing scratches from CMP. The process produces better uniformity across the substrate and better electrical performance due the increased copper line cross-sectional area.

21 Claims, 3 Drawing Sheets

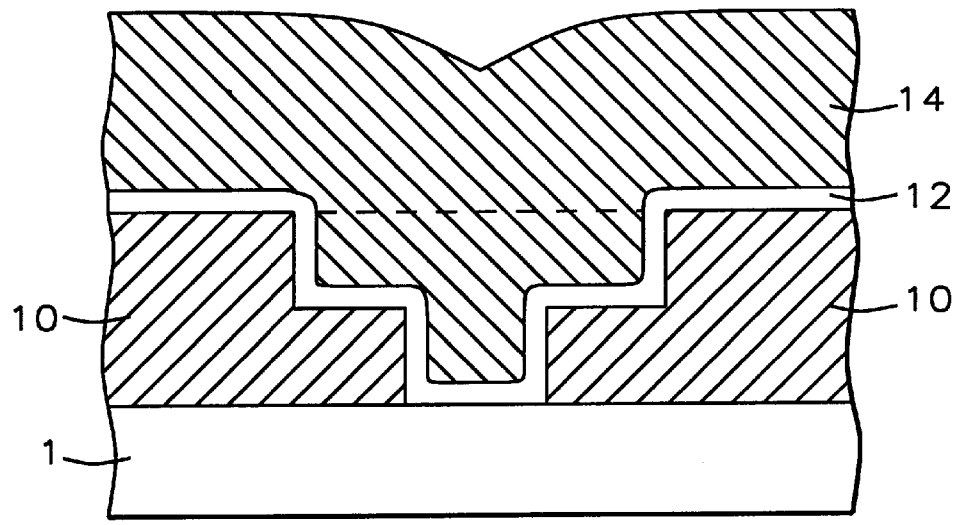
FIG. 1a - Prior Art
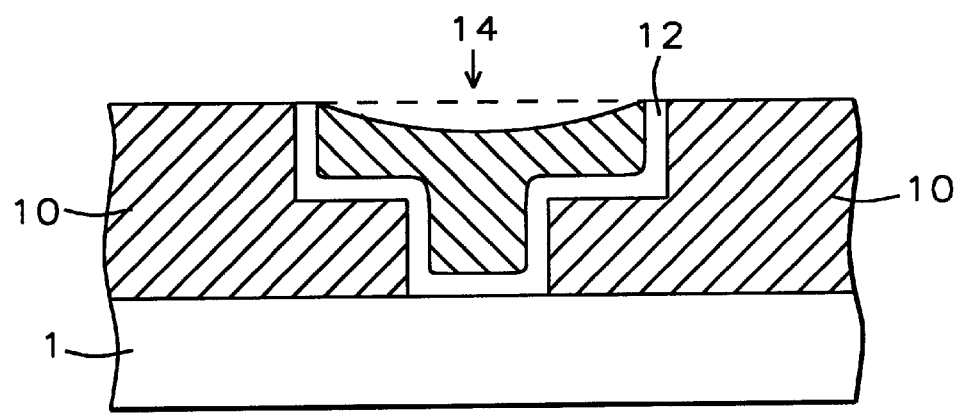
FIG. 1b - Prior Art

COPPER INTERCONNECT PATTERNING

BACKGROUND OF THE INVENTION

(1) Field of the Invention

This invention relates to a method of fabrication used in the semiconductor integrated circuit devices, and more specifically to the formation of planarized structures of conducting copper lines and interconnects (studs) using a dual damascene process with unique techniques for removing the excess copper, such as, vapor and liquid acid etch back of copper oxides.

(2) Description of Related Art

In the fabrication of semiconductor integrated circuits CMP (Chemical Mechanical Polishing) is typically used to remove copper in a dual damascene process, whereby inlaid structures are made with insulating oxide material. The inlaid structures are filled with copper by collimated sputter deposition, for example. After metal deposition the excess copper is removed and planarized usually by CMP. Chemical and mechanical selectivities between materials are necessary, since CMP must remove the copper metal without removing large amounts of inlaid metal. The copper forms conducting lines and interconnect (plugs), which connect upper and lower interconnection layers. CMP is widely used, however it will be shown that the present invention uses acids in vapor and liquid, in combination with oxygen, to form copper oxides and said copper oxides are subsequently etched back to form planar copper structures.

U.S. Pat. No. 5,736,457 to Zhao shows a copper single and dual damascene process whereby the excess copper is exposed by a masking layer and etched back to an etch stop layer of TiN, for planarization.

U.S. Pat. No. 5,567,300 to Datta and O'Toole describes a copper electrochemical planarization process. A neutral salt solution is used and is compatible with a plating process.

U.S. Pat. No. 5,614,765 to Avanzino et al shows a self aligned via dual damascene process utilizing only one mask pattern for conducting lines and vias.

U.S. Pat. No. 5,674,787 to Zhao et al describes electroless copper deposited interconnect plugs for ULSI applications. The invention features sidewall via liners SiN or SiON. A contact displacement technique is used to form a thin activation layer of copper on a barrier metal, such as TiN, which is present as a covering layer on the underlying metal layer.

U.S. Pat. No. 5,585,673 to Joshi et al describes Al—Cu alloy and copper lines deposited by PVD (evaporated or sputtered) and covered with CVD W refractory metal. Capping a low resistivity metal conductor line or via with refractory metal allows for effectively using CMP because of the hard, reduced wear nature of the refractory metals.

U.S. Pat. No. 5,595,937 to Mikagi shows a trench damascene process for interconnections buried in trenches. Interconnect trench and contact hole are lined with TiN or Ti. A Cu film grown by MO-CVD, and thereafter the Cu film and TiN/Ti film on the surface of the substrate are partially removed by CMP.

U.S. Pat. No. 5,723,387 to Chen describes a self contained apparatus for multiple process step for dual copper damascene process. The patent incorporates wet processes including electroless metal plating and planarization. Exposed portions of a barrier layer are selectively removed by a wet etch.

SUMMARY OF THE INVENTION

It is the general object of the present invention to provide an improved method of forming an integrated circuit in which a special dual damascene process forms planar copper wiring and interconnects (studs) using etch back techniques of copper oxide. This technique does not cause scratches as is the case with CMP. Further, vapor and liquid acids and oxidizing agents do not contaminate the surface.

A more specific object of the present invention is to provide an improved method of forming an integrated circuit in which steam, pyrogenic $H_2O$, and $O_2$ are used to oxidize copper metal. Said copper oxide is then removed by HCl acid both gaseous and liquid form, as said copper oxide layer is etched back. Said layer can be etched back sequentially, as well as, simultaneously as it is formed.

A further object of the present invention is to treat the planarized copper surface with corrosion protect layer of a few monolayer thick with either BTA or TTA.

In accordance with the objects of the invention a new method of forming improved metal lines and interconnects (studs) in a efficient dual-damascene CMP process is achieved.

First the insulating layer is deposited on a substrate. In one embodiment of this invention, substrate is any general underlying material. In another embodiment of this invention, substrate is to mean a multi-level metal structure. In yet another embodiment of this invention, substrate is a semiconductor surface with a diffusion contact. Hence, three embodiments are general substrate, multi-level metal, and a semiconductor diffusion contact.

In said method of dual-damascene, the insulator is patterned using two photo lithography masking steps and two etch steps to form the contact vias and then trenches in the insulating material.

Next a blanket liner layer of the Ta or TaN is conformally deposited. This conformal layer of Ta/TaN forms a conducting diffusion barrier layer.

Next copper metal is deposited by collimated sputter deposition for good via and trench fill properties.

In this conventional process, standard CMP is known to cause dishing due the soft nature of the copper metal.

This invention uses several approaches to oxidize the copper to form copper oxides and acids to etch back the copper oxide layer. The first method is to use $O_2$ gas in an oxidation furnace in combination with HCl gas simultaneously oxidizing the Cu film and removing copper oxides with the HCl gas until the copper is etched to the surface. The Cu is planarized with out the problem of dishing. Said method can be performed simultaneously with oxidation and removal of Cu oxide or said method can also be performed sequentially, the Cu is oxidized and the subsequently removed in another process step.

Another variation of this etch back method is to use pyrogenic $H_2O$ in combination with HCl gas, which uses same mechanism of oxidation and etching as said method above. Said method can be performed simultaneously with oxidation and removal of Cu oxide or said method can be performed sequentially, wherein the Cu is oxidized and subsequently removed in another process step.

Still another method is the use of steam and/or hot DI $H_2O$ followed by dilute HCl 0.1M approximately. This is followed by DI $H_2O$ rinse and $N_2$ blow dry.

Furthermore, a corrosion protection layer of a few monolayers of BTA or TTA can be coated on the surface of the copper and Ta/TaN layer. Said corrosion coating can be applied to all the methods and processes described above.

This novel approach eliminates dishing and eliminates exposing the soft copper metal to abrasive slurries.

BRIEF DESCRIPTION OF THE DRAWINGS

The object and other advantages of this invention are best described in the preferred embodiments with reference to the attach drawing that include:

FIGS. 1A–1B, which in cross-sectional representation illustrate the method of prior art.

FIG. 1a shows the starting point the copper damascene process illustrating the copper deposition in the trench and via.

DESCRIPTION OF THE PREFERRED EMBODIMENTS

FIG. 1a illustrates the layers typically used in CMP dual damascene process. The substrate 1 is a semiconductor. Insulating layer 10 is shown with a trench and via pattern. Layer 12 is typically Ta or TaN and acts as a liner for the trench and via cavity. In FIG. 1b CMP Cu metal 14 is shown with a dished structure below the dotted line of the top surface. The embodiments of this invention solve the problem of Cu dishing.

The new and improved method of using a chemical etch back technique to define a dual damascene metal pattern will now be described in detail. This process produces conducting copper metal lines and vias with planar metal without the problem of dishing.

Referring now more particularly to FIG. 1a, there is shown a substrate 1, or semiconductor with a partially completed cross-section of a conducting line and interconnect (stud). Isolation insulating material 10 is shown with the trench and via patterns for dual damascene in place.

Layer 12 is a Ta or TaN layer which lines the trench and via regions covering all of the top surface. Next the conducting metal, copper, 14 is shown deposited in a blanket layer covering all the layers. The copper layer dips into the trench and vias opens.

First the insulating layer, in a thickness from 4,000 to 12,000 Å can be: PE TEOS deposited oxide, (plasma enhanced tetraethylorthosilicate oxide, silicon oxide, BPSG borophosphosilicate glass, deposited on the substrate.

In the typical method of dual-damascene, the oxide is patterned using two photo lithography masking steps and RIE steps to form the contact vias and then the line trenches in the insulating oxide.

Next a blanket liner layer of the Ta or TaN is deposited. This conformal layer consists of Ta or TaN and is deposited by PVD and in the thickness range of 200 to 500 Å. The preferred liner film is a layer of TaN.

Next copper metal is deposited by collimated sputter deposition, CVD or electroplating for good via and trench fill properties. Copper thickness is in the range from 10,000 to 30.000 Å.

Figure 2:
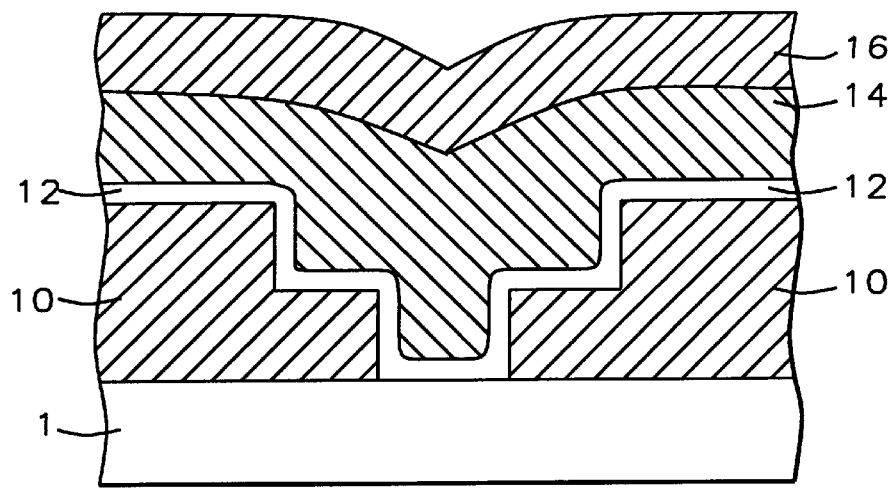
FIG. 2 through 7 schematically illustrate in cross-sectional representation a preferred embodiment of the process of the present invention. However.

FIG. 2 shows the result of the start of the etch back process, as a result of oxidation environment and the combination of acid, the top surface of the copper has been reduced from the thickness depicted in FIG. 1a. Copper oxides are sketched in FIG. 2 as layer 16. The remaining Cu is layer 14. Subsequently, the copper oxide layer 16 is removed by the acid etch back.

Figure 3:
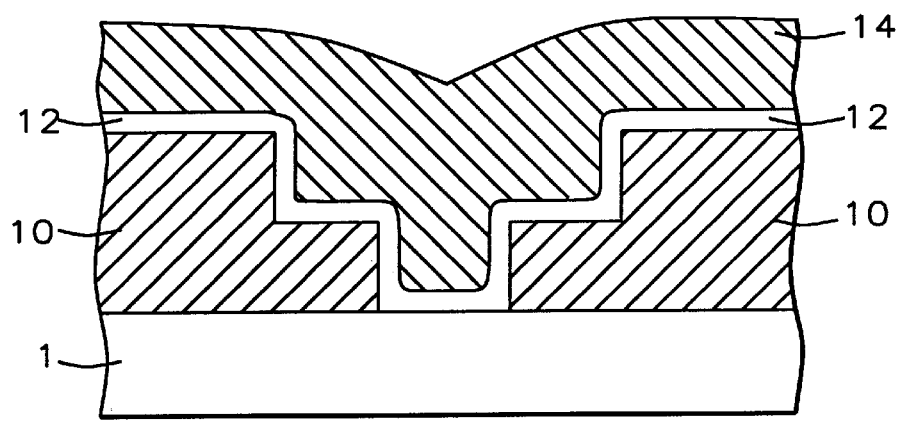

The etch back of the Cu oxide is shown in FIG. 3 with the oxide removed and Cu layer 14 remaining.

Figure 4:
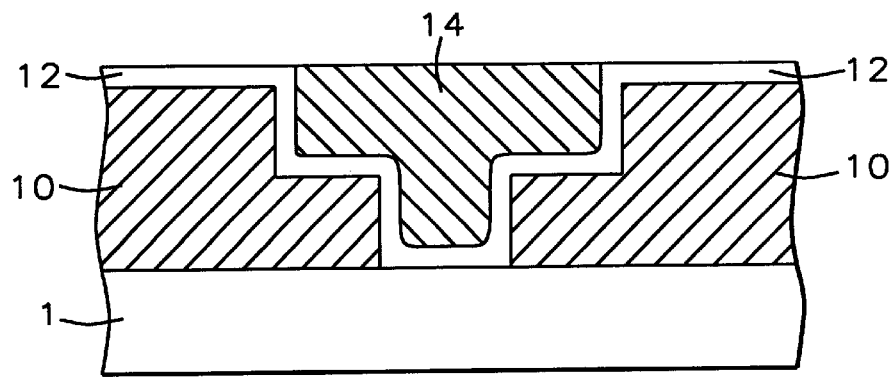

FIG. 4 shows the planar Cu surface after etch back. No dishing occurs.

Figure 5:
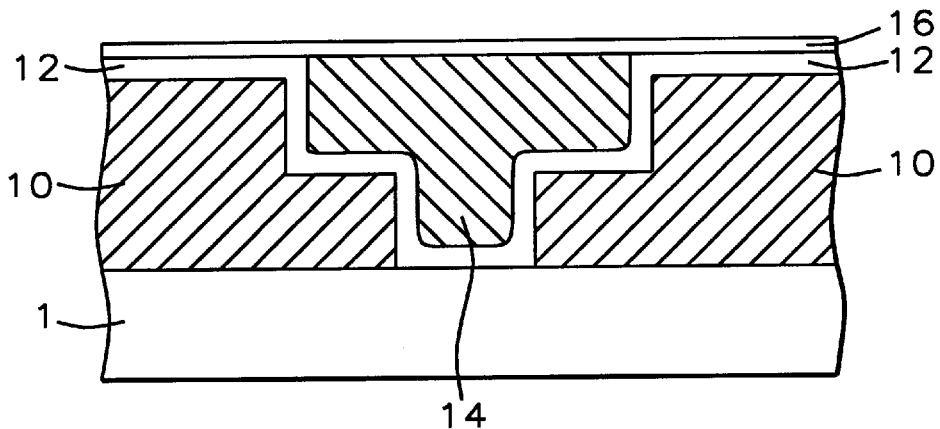

FIG. 5 depicts several monolayers of corrosion protection. The layer 16 coats the entire top surface and can be BTA or TTA. BTA is Benzo-Triazol and TTA is Tetra-Triazol.

Preferred embodiments are for oxidation: $O_2$ gas, steam vapor, and pyrogenic water. For wet processing, said DI water final rinse followed by a nitrogen blow dry process.

For said acid treatments, it is specified as HCl gas and liquid HCl solution at approximated 0.1 Molar.

The conducting Ta or TaN lines the via and trench and aids in containing the copper acting as a diffusion barrier. The important conducting copper lines and inter-connects (studs) show no dishing and are not thinned.

Several variations of said processes for this invention are as the follows and said processes can be performed in a sequential mode, as well as, in a simultaneous mode as one process step, in a furnace/reactor:

1. Sequential oxidation and removal of copper using $O_2$ and HCl gas from room temperature to very high temperatures in a furnace or reactor. The process of sequential oxidation and etching is continued until the desired removal is achieved.
2. Sequential oxidation and removal of copper using pyrogenic $H_2O$ and HCl gas from room temperature to very high temperatures furnace or reactor. The process of sequential oxidation and etching is continued until the desired removal is achieved.
3. Sequential oxidation and removal of copper using steam and/or de-ionized water followed by etching of the Cu oxide using dilute HCl (approximately 0.1 Molar). The process of sequential oxidation and etching is continued until the desired removal is achieved. The surface is then thoroughly rinsed in DI water and nitrogen blown dry. Said process is then followed by a coating of several monolayers of BTA, Benzo-Triazol or TTA, Tetra-Triazol for corrosion protection. These said processes are carried out in a bath or spray/spin station.

The process of the present invention avoids thinning of the conducting lines which increases line or wire resistance. Dishing and other non-uniformities across the substrate are eliminated. These improvements are brought about by the use the etch techniques. Endpoint for the etch back is achieved by process tuning. The Ta or TaN is left behind as a trench/via liner, to act a diffusion barrier for copper. The etch back stops on said layer.

Figure 6:
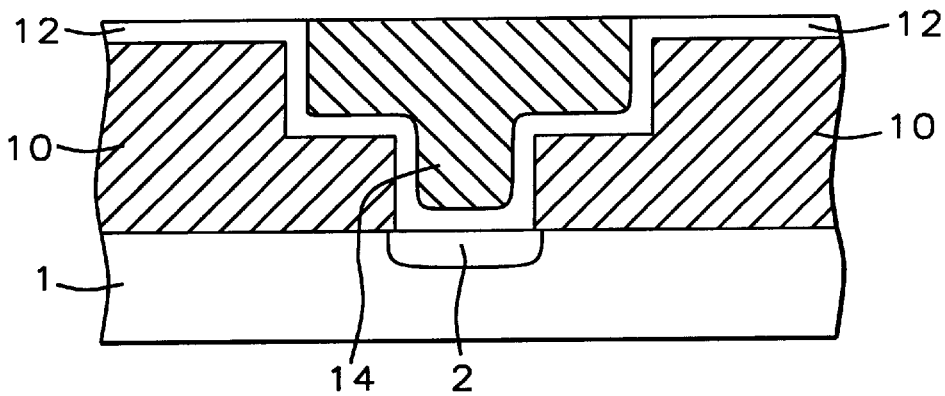
Figure 7:
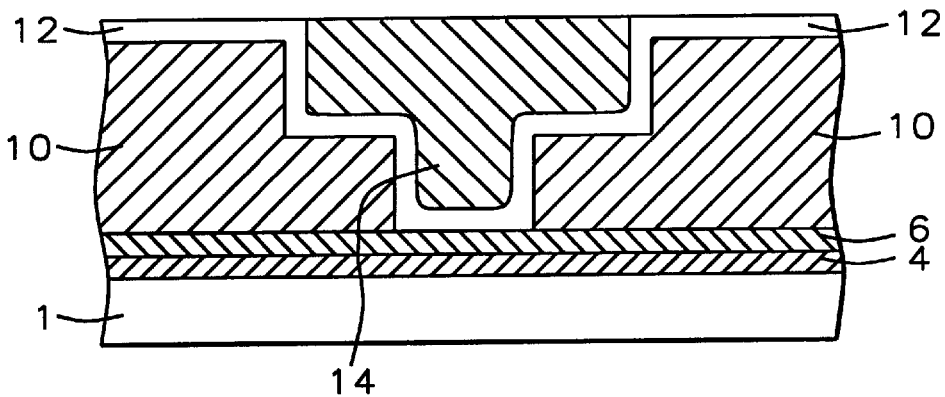

FIG. 6 and FIG. 7 show two applications of the present invention. Only the specific areas unique to the understanding of this invention will be described in detail. FIG. 6 shows a semiconductor substrate 1 with a diffusion area 2 being contacted by trench and via 14. FIG. 7 shows another general application whereby the trench and via 14 contact a multi-level conducting metal line 6, which is on an interlevel dielectric layer 4 on a semiconductor substrate 1.

While the invention has been particularly shown and described with reference to the preferred embodiments thereof, it will be understood by those skilled in the art that various changes in the form and details may be made without departing from the spirit and scope of the invention.

What is claimed is:

1. A method of forming conducting metal lines and interconnects (studs) in vias and trenches in the fabrication of integrated circuit devices, that forms planarized structures comprising:

providing a substrate upon which insulating material is deposited;

said insulating material is patterned and etched to form via holes and trenches in a dual damascene process;

depositing a conducting barrier layer that conforms to the insulating material and to the via holes and trenches;

said barrier layer lines said via holes and trenches;

depositing a conducting metal over the entire substrate filling said via holes and trenches;

oxidizing the surface of said conducting metal layer over the entire substrate, using oxidizing agents to form a metal oxide layer; and etching back said metal oxide layer by purely chemical means, stopping on the barrier layer.

2. The method of claim 1, wherein said oxidizing and said etching back of said conducting metal layer are performed simultaneously.

3. The method of claim 1, wherein said oxidizing and said etching back of said conducting metal layer are performed sequentially.

4. The method of claim 1, wherein said insulating material is selected from the group consisting of silicon oxide, BPSG, boro phosphosilicate glass type materials.

5. The method of claim 1, wherein said barrier layer material is conducting Ta/TaN.

6. The method of claim 1, wherein said barrier layer of Ta/TaN acts a via hole and trench liner.

7. The method of claim 1, wherein said layer of Ta/TaN acts an etch stop layer for said etch back.

8. The method of claim 1, wherein said conducting metal layer is copper.

9. The method of claim 1, wherein said thin films of Ta, and TaN are deposited by CVD.

10. The method of claim 1, wherein said dual damascene technique forms conductive contacts to semiconductor diffusions and interconnection wiring patterns, in the fabrication of MOSFET's.

11. The method of claim 1, wherein said dual damascene technique forms conductive contacts to multi-level metal lines and interconnection wiring patterns, in the fabrication of semiconductor devices.

12. The method of claim 1, wherein etch back process is an efficient process and solves the Cu dishing problem.

13. A method of forming conducting copper metal lines and interconnects (studs) in vias and trenches in the fabrication of integrated circuit devices, that forms planarized structures comprising:

providing a substrate upon which insulating material is deposited;

said insulating material is patterned and etched to form via holes and trenches in a dual damascene process;

depositing a conducting barrier layer of Ta/TaN that conforms to the insulating material and to the via holes and trenches;

said barrier layer lines said via holes and trenches;

depositing a conducting copper metal over the entire substrate filling said via holes and trenches;

providing a reactor;

introducing $O_2$ and HCl gas into said reactor to form copper oxide and removing copper oxide by HCl acidic gas and continuing until the conducting copper metal is planarized back to said conducting barrier layer.

14. The method of claim 13, wherein the oxidation of copper and removal of said copper oxide is repeated sequentially until the etch back is complete.

15. The method of claim 13, wherein the oxidation of copper and removal of said copper oxide occurs simultaneously until the etch back is complete.

16. A method of forming conducting copper metal lines and interconnects (studs) in vias and trenches in the fabrication of integrated circuit devices, that forms planarized structures comprising:

providing a substrate upon which insulating material is deposited;

said insulating material is patterned and etched to form via holes and trenches in a dual damascene process;

depositing a conducting barrier layer of Ta/TaN that conforms to the insulating material and to the via holes and trenches;

said barrier layer lines said via holes and trenches;

depositing a conducting copper metal over the entire substrate filling said via holes and trenches;

providing a reactor;

introducing pyrogenic $H_2O$ and HCl gas into said reactor to form copper oxide and removing copper oxide by HCl acidic gas and continuing until the conducting copper metal is planarized back to said conducting barrier layer.

17. The method of claim 16, wherein the oxidation of copper and removal of said copper oxide is repeated sequentially until the etch back is complete.

18. The method of claim 16, wherein the oxidation of copper and removal of said copper oxide occurs simultaneously until the etch back is complete.

19. A method of forming conducting copper metal lines and interconnects (studs) in vias and trenches in the fabrication of integrated circuit devices, that forms planarized structures comprising:

providing a substrate upon which insulating material is deposited;

said insulating material is patterned and etched to form via holes and trenches in a dual damascene process;

depositing a conducting barrier layer of Ta/TaN that conforms to the insulating material and to the via holes and trenches;

said barrier layer lines said via holes and trenches;

depositing a conducting copper metal over the entire substrate filling said via holes and trenches;

providing a bath or spray/spin station;

providing steam and/or de-ionized water to oxidize conducting copper metal forming copper oxide;

providing dilute HCl (approximately 0.1 Molar) for copper oxide removal and continuing removal of copper oxide until the conducting copper metal is planarized back to said conducting barrier layer;

providing a DI water rinse in $N_2$ blow dry followed by a thin coating of BTA, Benzo-Triazol or TTA, Tetra-Triazol corrosion protection material.

20. The method of claim 19, wherein the oxidation of copper and removal of copper oxide is repeated sequentially until the etch back is complete.

21. The method of claim 19, wherein the oxidation of copper and removal of copper oxide occurs simultaneously until the etch back is complete.

* * * * *